United States Patent
Cote et al.

(10) Patent No.: US 6,252,295 B1
(45) Date of Patent: Jun. 26, 2001

(54) ADHESION OF SILICON CARBIDE FILMS

(75) Inventors: Donna R. Cote, Poughkeepsie; Daniel C. Edelstein, White Plains; John A. Fitzsimmons, Poughkeepsie; Thomas H. Ivers; Paul C. Jamison, both of Hopewell Junction; Ernest Levine, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/597,902

(22) Filed: Jun. 19, 2000

(51) Int. Cl.$^7$ ..................................... H01L 23/58
(52) U.S. Cl. .................. 257/635; 257/636; 257/639; 257/640
(58) Field of Search .................... 257/636, 639, 257/640

(56) References Cited

U.S. PATENT DOCUMENTS

| | | | |
|---|---|---|---|
| 4,814,056 | 3/1989 | Welty | 204/298 |
| 4,885,220 | 12/1989 | Kuhman et al. | 430/31 |
| 5,238,866 | 8/1993 | Bolz et al. | 437/100 |
| 5,309,874 | * 5/1994 | Willermet et al. | 123/90.51 |
| 5,609,948 | 3/1997 | David et al. | 428/216 |
| 5,926,740 | * 7/1999 | Forbes et al. | 438/763 |
| 6,077,760 | * 6/2000 | Fang et al. | 438/492 |
| 6,114,048 | * 9/2000 | Jech et al. | 428/547 |
| 6,184,572 | * 2/2001 | Mountsier et al. | 257/637 |

FOREIGN PATENT DOCUMENTS

| | | |
|---|---|---|
| 60-213021 | 10/1985 | (JP) . |
| 11-67062 | 3/1999 | (JP) . |

OTHER PUBLICATIONS

Thermal Ink Jet Heater Devices Incorporating Diamond–Like Carbon Films as Protective Overcoats, *IBM Technical Disclosure Bulletin*, vol. 34, No. 2, Jul. 1991, pp. 19–20.

* cited by examiner

Primary Examiner—John F. Niebling
Assistant Examiner—Alexander G. Ghyka
(74) Attorney, Agent, or Firm—Connolly Bove Lodge & Hutz; Jay H. Anderson

(57) ABSTRACT

The adhesion of a silicon carbide containing film to a surface is enhanced by employing a transition film of silicon nitride, silicon dioxide and/or silicon oxynitride.

14 Claims, No Drawings

ADHESION OF SILICON CARBIDE FILMS

DESCRIPTION

TECHNICAL FIELD

The present invention relates to structures comprising silicon carbide containing films and particularly to structures exhibiting enhanced adhesion of the silicon carbide. In addition, the present invention relates to a method for fabricating the silicon carbide containing structures of the present invention. The present invention is especially concerned with semiconductor structures.

BACKGROUND OF INVENTION

The fabrication of semiconductor devices requires providing insulating or dielectric materials at various selected regions of the device. For instance, among the more widely used dielectric materials are silicon dioxide, silicon nitride, silicon oxynitride, certain silicate glasses, and some organic resins. In fact, in some devices, air has been suggested as the desired dielectric.

More recently, amorphous silicon carbide films have been proposed as the interlevel dielectric materials in multilevel semiconductor Back End of Line (BEOL) process integration schemes. Amorphous silicon carbide films exhibit relatively low k values, thereby making them a potential interlevel dielectric.

It has been observed, however, that the adhesion of silicon carbide films to various surfaces employed in semiconductor devices is not as tenacious as would be desired in typical integration schemes. In particular, it has been found that silicon carbide films do not adhere especially well to the typical metallurgy employed in semiconductor devices Such as copper, aluminum and alloys thereof. Also, it has been found that the bond between silicon carbide films and silicon oxide interfaces typically found in semiconductor devices is not as strong as would be desired.

Accordingly, providing for enhanced adhesion between silicon carbide films and these surfaces would be a significant improvement in the art.

SUMMARY OF INVENTION

The present invention provides for enhanced adhesion of silicon carbide to various surfaces found in semiconductor structures. According to the present invention, a graded seal deposition is employed to provide for this improved adhesion.

More particularly, the present invention relates to a structure that comprises a surface selected from the group consisting of a metallic surface and silicon dioxide. A graded deposited film of at least one member selected from the group consisting of silicon dioxide, silicon nitride, and silicon oxynitride is located adjacent the surface. The silicon carbide containing film is located adjacent the graded deposited film. The graded deposited film provides for the enhanced adhesion between the silicon carbide containing film and the above defined surface.

The present invention also relates to a method for fabricating a structure which comprises providing a surface selected from the group consisting of a metallic surface and silicon dioxide. A graded film of at least one member selected from the group consisting of silicon dioxide, silicon nitride, and silicon oxynitride is deposited adjacent the surface. A silicon carbide containing film is then deposited adjacent the graded deposit film.

The present invention also relates to structures obtained by the above process.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details arc capable of modifications in various obvious respects, without departing from the invention. Accordingly, the description is to be regarded as illustrative in nature and not as restrictive.

BEST AND VARIOUS MODES FOR CARRYING OUT INVENTION

According to the present invention, the surface to which the silicon carbide layer is to be joined includes those metallic surfaces used in semiconductors and/or silicon dioxide. Examples of metallic surfaces include aluminum, copper and alloys of aluminum and alloys of copper, the preferred metal being copper or alloys thereof.

According to the present invention, a graded deposited film of silicon dioxide, silicon nitride and/or silicon oxynitride is deposited between the silicon carbide containing film and the surface as defined above. The graded deposited film is typically about 25 to about 300 angstroms thick, and more typically about 25 to about 75 angstroms thick. The graded film is typically deposited by chemical vapor deposition (CVD) and preferably by plasma enhanced chemical vapor deposition (PECVD). The deposition process comprises placing the structure, e.g. a wafer, having the metallic and/or silicon dioxide surface thereon into a vacuum chamber and then causing the reactive gases to flow into the chamber and contact the structure. By way of example, when the graded layer or film interposed between the metal or silicon dioxide layer and the silicon carbide layer is silicon nitride, the film exhibits a continuous transition from silicon nitride to a silicon nitride/silicon carbide mixture to silicon carbide. The graded layer is formed by first initiating the gas flows to form pure silicon nitride and then gradually increasing the silicon carbide precursor gases while reducing the nitride gases until finally the gas mixture contains only the silicon carbide precursor gases. The rate of the gradual change of flows for any particular case can be determined by persons skilled in the art once aware of the present disclosure without undue experimentation. In other words, the deposition occurs as a multistep deposition process within a single chamber so that no discrete interface is formed between the silicon nitride and silicon carbide layers. In the case of creating a silicon nitride graded deposited film, a mixture of vapors comprising a silicon containing gas and a nitrogen containing gas is introduced. Suitable silicon containing reactive gases include silanes such as silane, disilane, trisilane, tetrasilane, dichlorosilane, and trichlorosilane. Suitable reactive nitrogen containing gases include ammonia and nitrogen. In addition, deuterated forms of these gases where deuterium replaces hydrogen can be used. If desired, a diluent gas can also be present such as nitrogen, helium or argon. In the case of forming a silicon oxide layer, a silicon containing gas as disclosed above and an oxidant are typically employed. Suitable oxidants include oxygen and $N_2O$. Also, if desired, silicon oxide film can be formed by employing tetraethylorthosilicate (TEOS).

In the case of silicon oxynitride, a silicon containing gas, an oxidant and a reactive nitrogen containing gas such as those disclosed above can be employed.

The deposition of the graded film is typically carried out at temperatures of about 250° C. to about 600° C. at pressures of about 0.5 torr to about 15 torr, and more typically about 3 to about 6, and flow rates of about 10 sccm to about 500 sccm, and more typically about 20 sccm to about 100 sccm.

In the case of plasma enhanced deposition, a RF plasma deposition typically operating at about 13.56 megahertz can be employed. The power density typically employed is about 25 to about 1000 watts/200 mm and more typically about 100 to about 600 watts/200 mm.

After the desired thickness of the graded deposited film is achieved, the silicon carbide film is then deposited. Such can be deposited by employing chemical vapor deposition and preferably plasma enhanced chemical vapor deposition. More particularly, typically the silicon carbide film is deposited, upon discontinuation of the flow of gases for the graded deposited transition film, by beginning the flow of the gases for creating the silicon carbide film. Along these lines, a typical reactant is trimethylsilane. The trimethylsilane is typically employed in the presence of an inert gaseous diluent such as helium. If desired, the silicon containing gas employed in forming the graded deposited film can be used along with the trimethylsilane in order to o adjust or control the ratio of silicon and carbon in the silicon carbide film. Other suitable gaseous reactions include tetramethylsilane and tetramethylsilane in combination with tetrahydroxysilane for purposes of regulating the ratio of silicon and carbon in the silicon carbide layer. The conditions of the deposition employed are typically the same as those employed for producing the graded deposited film, and typically selected to minimize deposition rate.

The silicon carbide film is typically about 100 to about 1500 angstroms, and more typically about 200 to about 600 angstroms.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A structure comprising a surface selected from the group consisting of a metallic surface and silicon dioxide; a graded deposited film of at least one member selected from the group consisting of silicon dioxide, silicon nitride and silicon oxynitride; located adjacent the surface; and a silicon carbide containing film located adjacent the graded deposited film.

2. The structure of claim 1 wherein the surface is silicon dioxide.

3. The structure of claim 1 wherein the surface comprises a metallic surface.

4. The structure of claim 3 wherein the metallic surface comprises aluminum, copper or alloys thereof.

5. The structure of claim 3 wherein the metallic surface comprises copper or alloys thereof.

6. The structure of claim 1 wherein the graded deposited film comprises silicon nitride.

7. The structure of claim 1 wherein the deposited film comprises silicon dioxide.

8. The structure of claim 1 wherein the structure comprises silicon oxynitride.

9. The structure of claim 1 wherein the graded deposited film and silicon carbide containing film are deposited by chemical vapor deposition.

10. The structure of claim 9 wherein the chemical vapor deposition is plasma enhanced chemical vapor deposition.

11. The structure of claim 1 wherein the graded deposited film is about 25 to about 300 angstroms thick.

12. The structure of claim 11 wherein the silicon carbide containing film is about 100 to about 1500 angstroms thick.

13. The structure of claim 1 wherein the silicon carbide containing film is amorphous silicon carbide.

14. The structure of claim 1 being a semiconductor structure.

* * * * *